United States Patent
Choi et al.

(10) Patent No.: US 8,637,885 B2
(45) Date of Patent: Jan. 28, 2014

(54) LIGHT EMITTING DEVICE, LIGHT EMITTING DEVICE PACKAGE, METHOD OF MANUFACTURING LIGHT EMITTING DEVICE AND LIGHTING SYSTEM

(75) Inventors: Kwang Ki Choi, Seoul (KR); Hwan Hee Jeong, Seoul (KR); Sang Youl Lee, Seoul (KR); June O Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/027,952

(22) Filed: Feb. 15, 2011

(65) Prior Publication Data

US 2011/0198621 A1  Aug. 18, 2011

(30) Foreign Application Priority Data

Feb. 18, 2010  (KR) .................. 10-2010-0014438

(51) Int. Cl.
 *H01L 33/00* (2010.01)
(52) U.S. Cl.
 USPC ............... 257/98; 257/E27.12; 257/E33.068
(58) Field of Classification Search
 USPC .......... 257/81, 88, 99, 98, E21.12, E33.062, 257/E33.068
 See application file for complete search history.

(56) References Cited

U.S. PATENT DOCUMENTS

| | | | |
|---|---|---|---|
| 4,967,241 A | 10/1990 | Kinoshita et al. | |
| 7,411,221 B2 | 8/2008 | Cho et al. | |
| 7,566,909 B2 | 7/2009 | Koyama | |
| 8,003,994 B2 | 8/2011 | Liu et al. | |
| 8,269,224 B2 | 9/2012 | Park | |
| 2002/0139987 A1 | 10/2002 | Collins, III et al. | |
| 2003/0189201 A1* | 10/2003 | Chen | 257/13 |
| 2005/0230692 A1* | 10/2005 | Kim et al. | 257/79 |
| 2006/0081857 A1* | 4/2006 | Hong et al. | 257/84 |
| 2007/0133637 A1 | 6/2007 | Imai | |
| 2008/0149953 A1 | 6/2008 | Ando et al. | |
| 2008/0265272 A1 | 10/2008 | Oh et al. | |
| 2008/0308829 A1* | 12/2008 | Liu et al. | 257/98 |
| 2009/0057692 A1 | 3/2009 | Lee | |
| 2010/0038672 A1* | 2/2010 | Park | 257/99 |
| 2010/0065872 A1* | 3/2010 | Lee | 257/98 |
| 2010/0200884 A1* | 8/2010 | Lee et al. | 257/98 |
| 2010/0207154 A1* | 8/2010 | Song et al. | 257/98 |
| 2011/0140159 A1* | 6/2011 | Aoyagi | 257/99 |

FOREIGN PATENT DOCUMENTS

| | | |
|---|---|---|
| CN | 101385152 A | 3/2009 |
| CN | 101540361 A | 9/2009 |
| JP | 62-299092 A | 12/1987 |
| JP | 6-334271 A | 12/1994 |
| JP | 11-214747 A | 8/1999 |
| JP | 2006-108204 A | 4/2006 |
| JP | 2006-216846 A | 8/2006 |
| JP | 2007-158215 A | 6/2007 |
| JP | 2010-027643 A | 2/2010 |
| JP | 2010-529697 A | 8/2010 |
| KR | 10-0730754 B1 | 6/2007 |

(Continued)

*Primary Examiner* — William D Coleman
*Assistant Examiner* — Christine Enad
(74) *Attorney, Agent, or Firm* — Birch, Stewart, Kolasch & Birch, LLP

(57) ABSTRACT

A light emitting device according to the embodiment includes a conductive support member; a light emitting structure on the conductive support member including a first conductive semiconductor layer, a second conductive semiconductor layer, and an active layer between the first and second semiconductor layers; and a protective device on the light emitting structure.

20 Claims, 9 Drawing Sheets

(56) References Cited

FOREIGN PATENT DOCUMENTS

| | | |
|---|---|---|
| KR | 10-2007-0097619 A | 10/2007 |
| KR | 10-2010-0019761 A | 2/2010 |
| TW | 200929595 A | 7/2009 |
| WO | WO 2007/126282 A1 | 11/2007 |
| WO | WO 2008120947 A1 * | 10/2008 |
| WO | WO 2008/154573 A1 | 12/2008 |
| WO | WO 2009002040 A2 * | 12/2008 |

* cited by examiner

LIGHT EMITTING DEVICE, LIGHT EMITTING DEVICE PACKAGE, METHOD OF MANUFACTURING LIGHT EMITTING DEVICE AND LIGHTING SYSTEM

BACKGROUND

The embodiment relates to a light emitting device, a method of manufacturing the same, and a light emitting device package.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device having a novel structure, a method of manufacturing the same, and a light emitting device package.

The embodiment provides a light emitting device capable of improving withstanding voltage characteristics and a method of manufacturing the same.

A light emitting device according to the embodiment includes a conductive support member; a second conductive semiconductor layer on the conductive support member; an active layer on the second conductive semiconductor layer; a first conductive semiconductor layer on the active layer; and a protective device on the first conductive semiconductor layer.

A method of manufacturing a light emitting device may include the steps of forming a light emitting structure by sequentially stacking a first conductive semiconductor layer, an active layer and a second conductive semiconductor layer on a silicon substrate; forming a conductive support member on the light emitting structure; forming a body of a protective device by selectively removing the silicon substrate; implanting a first conductive dopant into the body of the protective device; forming a doping part by implanting a second conductive dopant into a lower portion of the body; and forming an electrode on at least one of the body and the doping part.

The embodiment can provide a light emitting device having a novel structure, a method of manufacturing the same, and a light emitting device package.

The embodiment can provide a light emitting device capable of improving withstanding voltage characteristics and a method of manufacturing the same.

DETAILED DESCRIPTION OF THE EMBODIMENTS

Figure 1:
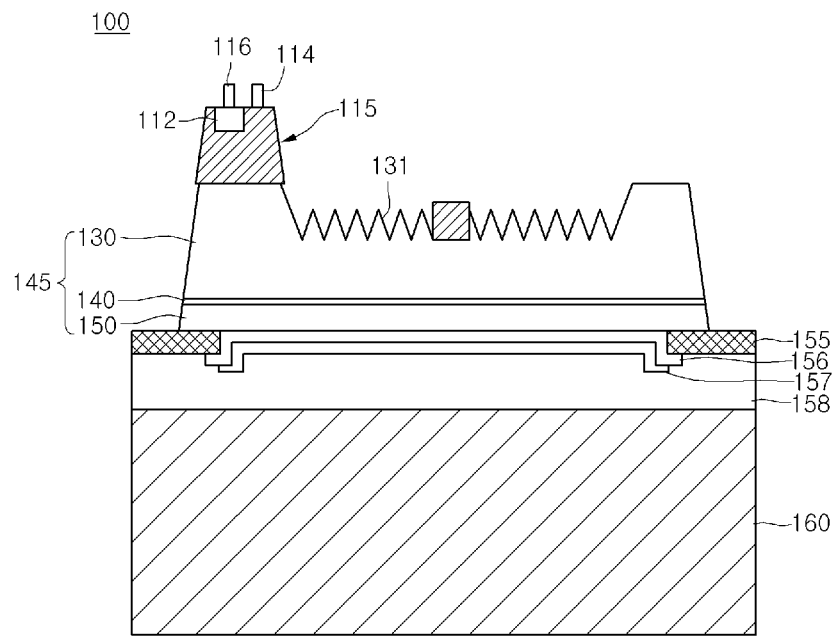
FIG. 1 is a sectional view of a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, the light emitting device, a method of manufacturing the same, a light emitting device package and a lighting system according to the embodiment will be described with reference to accompanying drawings.

Figure 2:
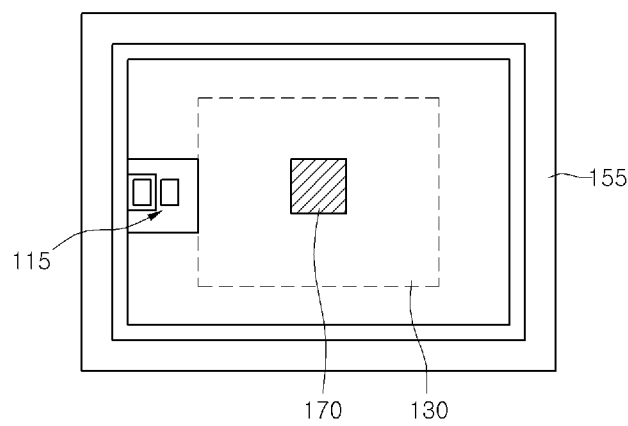
FIG. 2 is a plan view of a light emitting device according to the first embodiment.

FIG. 1 is a sectional view showing a light emitting device 100 according to the first embodiment and FIG. 2 is a plan view of the light emitting device 100.

Referring to FIGS. 1 and 2, the light emitting device 100 includes a conductive support member 160, an adhesive layer 158 on the conductive support member 160, a protective member 155 on a peripheral portion of a top surface of the conductive support member 160 or the adhesive layer 158, a reflective layer 157 on the adhesive layer 158, an ohmic contact layer 156 on the protective member 155, a light emitting structure 145 on the ohmic contact layer 156 and the protective member 155, a first electrode 170 on the light emitting structure 145, and a protective device 115 on the light emitting structure 145.

The light emitting structure 145 includes at least a first conductive semiconductor layer 130, an active layer 140 under the first conductive semiconductor layer 130, and a second conductive semiconductor layer 150 under the active layer 140. The first conductive semiconductor layer 130, the active layer 140 and the second conductive semiconductor layer 150 constitute a structure that generates light.

The conductive support member 160 supports the light emitting structure 145 and supplies power to the light emitting device 100 together with the first electrode 170.

The conductive support member 160 may include at least one of Ti, Cr, Ni, Al, Pt, Au, W, Cu, Mo, and a semiconductor substrate doped with impurities.

The adhesive layer 158 may be formed on the conductive support member 160. The adhesive layer 158 is a bonding layer to improve the interfacial bonding strength between the conductive support member 160 and the light emitting structure 145.

The adhesive layer 158 may include at least one of Ti, Au, Sn, Ni, Cr, Ga, In, Bi, Cu, Ag and Ta. In addition, the adhesive layer 158 may have a multi-layer structure including a plurality of heterogeneous layers.

The conductive support member 160 can be formed through the plating process or the deposition process. If the conductive support member 160 has sufficient adhesive property, the adhesive layer 158 may be omitted.

The protective member 155 can be formed on the peripheral portion of the top surface of the conductive support member 160 or the adhesive layer 158. The protective member 155 can prevent the electric short between the light emitting structure 145 and the conductive support member 160.

The protective member 155 may include a material having electric insulating property. For instance, the protective member 155 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, and ZnO.

The reflective layer 157 can be formed on the adhesive layer 158. The reflective layer 157 reflects the light incident from the light emitting structure 145 to improve the light emitting efficiency of the light emitting device 100.

The reflective layer 157 may include a material having high reflectivity. For instance, the reflective layer 157 can be formed by using a metal or a metal alloy including at least one selected from the group consisting of Ag, Ni, Al, Rh, Pd, Ir, Ru, Mg, Zn, Pt, Au, and Hf. In addition, the reflective layer 157 can be prepared as a multiple layer by using the above metal or metal alloy and a transmittive conductive material, such as IZO, IZTO, IAZO, IGZO, IGTO, AZO, or ATO. For instance, the reflective layer may have the stack structure including IZO/Ni, AZO/Ag, IZO/Ag/Ni, or AZO/Ag/Ni. The reflective layer 157 is provided to improve the light efficiency and may not be necessarily required. The ohmic contact layer 156 is formed on the reflective layer 157.

The ohmic contact layer 156 forms an ohmic contact such that current can flow between the reflective layer 157 and the light emitting structure 145.

If the reflective layer 157 forms an ohmic contact with respect to the light emitting structure 145, the ohmic contact layer 156 may be omitted, but the embodiment is not limited thereto.

The ohmic contact layer 156 may include at least one selected from the group consisting of ITO, Ni, Pt, Ir, Rh, and Ag, but the embodiment is not limited thereto. The ohmic contact layer 156 may selectively employ a transmittive conductive layer and a metal. The ohmic contact layer 156 can be prepared as a single layer or a multiple layer by using at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, $RuO_x$, $RuO_x$/ITO, Ni, Ag, Ni/$IrO_x$/Au, and Ni/$IrO_x$/Au/ITO.

The light emitting structure 145 may be formed on the ohmic contact layer 156 and the protective member 155. The light emitting structure 145 includes a plurality of semiconductor layers to generate the light. For instance, the light emitting structure 145 includes at least the first conductive semiconductor layer 130, the active layer 140 under the first conductive semiconductor layer 130, and the second conductive semiconductor layer 150 under the active layer 140.

For instance, the second conductive semiconductor layer 150 may include a p type semiconductor layer. The p type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For instance, the p type semiconductor layer may include InAlGaN, GaN, AlGaN, InGaN, AlN, or InN doped with p type dopant, such as Mg, Zn, Ca, Sr, or Ba.

The active layer 140 is formed on the second conductive semiconductor layer 150. The active layer 140 emits the light based on the bandgap difference of the energy band according to intrinsic material for the active layer 140 through the recombination of electrons (or holes) injected through the first conductive semiconductor layer 130 and holes (or electrons) injected through the second conductive semiconductor layer 150.

The active layer 140 may have at least one of a single quantum well structure, a multiple quantum well (MQW) structure, a quantum dot structure, or a quantum wire structure, but the embodiment is not limited thereto.

The active layer 140 may include a semiconductor material having a compositional formula of $In_xAl_yGa_{1-x-y}N$ ($0 \leq x \leq 1$, $0 \leq y \leq 1$, $0 \leq x+y \leq 1$). If the active layer 140 has the MQW structure, the active layer 140 may include a stack structure of InGaN well/GaN barrier layers.

A clad layer (not shown) doped with the n type or p type dopant can be formed on and/or under the active layer 140. The clad layer may include an AlGaN layer or an InAlGaN layer.

The first semiconductor layer 130 may be formed on the active layer 140. In addition, a pattern or a roughness 131 can be formed on the top surface of the first semiconductor layer 130 to improve the light extraction efficiency of the light emitting device 100.

An undoped semiconductor layer can be formed on the first semiconductor layer 130, but the embodiment is not limited thereto.

The first conductive semiconductor layer may include an n type semiconductor layer. The n type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For instance, the first conductive semiconductor layer may be selected from the group consisting of InAlGaN, GaN, AlGaN, InGaN, AlN, and InN, and may be doped with n type dopant such as Si, Ge, or Sn.

In contrast, the first conductive semiconductor layer 130 may include a p type semiconductor layer, and the second conductive semiconductor layer 150 may include an n type semiconductor layer. In addition, a third conductive semiconductor layer including an n type semiconductor layer or a p type semiconductor layer may be formed on the first conductive semiconductor layer 130. Accordingly, the light emitting device 100 may include at least one of NP, PN, NPN, and PNP junction structures. In addition, the doping concentration of impurities in the first and second conductive semiconductor layers may be uniform or irregular. In other words, the light emitting structure 145 may have various configurations, and the embodiment is not limited thereto.

A current blocking layer (not shown) may be formed between the ohmic contact layer 156 and the second conductive semiconductor layer 150. A top surface of the current blocking layer makes contact with the second conductive semiconductor layer 150 and a bottom surface and lateral sides of the current blocking layer make contact with the ohmic contact layer 156.

At least a part of the current blocking layer may overlap with the first electrode 170. Therefore, the current blocking layer can restrict the current from flowing through the shortest path between the first electrode 170 and the conductive support member 160, so that the light emitting efficiency of the light emitting device 100 can be improved.

The current blocking layer may include a material having electric conductivity lower than that of the reflective layer 157 or the ohmic contact layer 156, a material forming a schottky contact with respect to the second conductive semiconductor layer 150, or an electric insulating material.

For instance, the current blocking layer may include may include at least one of ZnO, $SiO_2$, SiON, $Si_3N_4$, $Al_2O_3$, $TiO_2$, Ti, Al and Cr.

The first electrode 170 and the protective device 115 may be formed on the first conductive semiconductor layer 130.

The first electrode 170 and the conductive support member 160 supply power to the light emitting device 100. For instance, the first electrode 170 includes at least one of Al, Ti, Cr, Ni, Cu, and Au. The first electrode 170 can be prepared as a multi-layer structure including a plurality of layers formed by using heterogeneous materials.

The protective device 115 is formed on the first conductive semiconductor layer 130. Preferably, the protective device 115 is formed on an outer peripheral portion of the top surface of the first conductive semiconductor layer 130 to minimize absorption of the light emitted from the light emitting structure 145.

The protective device 115 can protect the light emitting structure 145 from the surge or the electrostatic discharge occurs due to the over voltage, over current or reverse voltage. That is, when the over voltage, over current or reverse voltage is generated, the current flows to the protective device 115, other than the light emitting structure, so that the light emitting structure 145 can be prevented from being damaged, thereby improving the withstanding voltage characteristics of the light emitting device 100.

The protective device 115 can be formed on the first conductive semiconductor layer 130 of the light emitting structure 145. For instance, the protective device 115 can be formed in a micro-size by doping silicon in the semiconductor manufacturing process, so the protective device 115 can achieve the original purpose thereof without degrading the light emitting efficiency of the light emitting device 100.

The protective device 115 includes a conductive member 110a made from a silicon material and doped with p type dopant, a doping part 112 formed on the conductive member 110a and doped with n type dopant, a third electrode 114 on the conductive member 110a, and the second electrode 116 on the doping part 112.

The conductive member 110a includes a silicon material and can be formed by selectively removing a silicon substrate through an etching process. In detail, the silicon substrate, which is used to grow the light emitting structure 145, is selectively removed to form the conductive member 110a of the protective device 115, so that the manufacturing process can be simply performed with high efficiency.

The conductive member 110a is doped with p type dopant, so that the conductive member 110a constitutes a p type semiconductor. The p type dopant may include at least one of Mg, Be and B.

The doping part 112 can be formed on the conductive member 110a by implanting n type dopant into the top surface of the conductive member 110a. The n type dopant may include at least one of N, P, As and Sb.

If the first conductive semiconductor layer 130 is a p type semiconductor layer and the second conductive semiconductor layer 150 is an n type semiconductor layer, the n type dopant is implanted into the conductive member and the p type dopant is implanted into the doping part 112.

The third electrode 114 is formed on the conductive member 110a and the second electrode 116 is formed on the doping part 112. The second and third electrodes 116 and 114 are provided with wires electrically connected to external electrodes.

The first and third electrodes 170 and 114 can be electrically connected to the same external electrode, and the conductive support member 160 and the second electrode 116 are electrically connected to the same external electrode.

Figure 3:
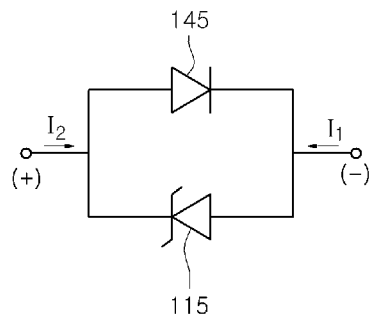
FIG. 3 is a circuit view showing an operational principle of a protective device of a light emitting device of FIG. 1.

FIG. 3 is a circuit view showing the operational principle of the protective device 115.

Referring to FIG. 3, the protective device 115 is connected to the light emitting structure 145 in parallel to serve as diodes that allow forward currents to flow in the opposite directions. In particular, the protective device 115 may serve as a Zener diode having breakdown voltage at least higher than operational voltage of the light emitting structure 145.

If a first current I1 is applied to the light emitting device 100, the first current I1 is a reverse current for the light emitting structure 145 and a forward current for the protective device 115, so the current flows only through the protective device 115.

In contrast, if a second current I2 is applied to the light emitting device 100, the second current I2 is a forward current for the light emitting structure 145 and a reverse current for the protective device 115, so the current flows only through the protective device 115, so that the light emitting device 100 emits the light.

Meanwhile, if the second current I2 is an over current subject to the over voltage higher than the breakdown voltage of the protective device 115, the protective device 115 is enabled due to the tunneling effect so that the current flows through protective device 115. That is, the over current flows through the protective device 115, other than the light emitting structure 145, so that the light emitting structure 145 can be prevented from being damaged.

The breakdown voltage of the protective device 115 may be higher than the operational voltage of the light emitting structure 145. For instance, the breakdown voltage of the protective device 115 may be in the range of 3V to 100V, but the embodiment is not limited thereto. The breakdown voltage of the protective device 115 may be determined by adjusting the size and the doping concentration of the conductive member 110a and the doping part 112.

As described above, the protective device 115 can be formed on the top surface of the light emitting structure 145 through the simple and efficient process, so that the light emitting device 100 can be protected from the over current and the reverse current, thereby improving the reliability of the light emitting device 100.

Hereinafter, the method of manufacturing the light emitting device 100 according to the first embodiment will be described in detail.

FIGS. 4 to 11 are sectional views showing the method of manufacturing the light emitting device 100 according to the first embodiment.

Figure 4:
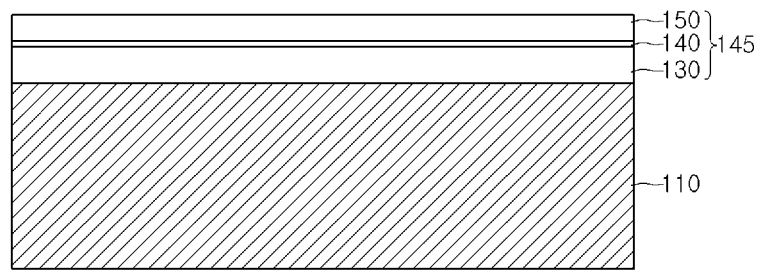
FIGS. 4 to 11 are sectional views showing a method of manufacturing a light emitting device according to the first embodiment.

Referring to FIG. 4, the light emitting structure 145 is formed on the silicon substrate 110. The light emitting structure 145 can be formed by sequentially depositing the first conductive semiconductor layer 130, the active layer 140, and the second conductive semiconductor layer 150 on the silicon substrate 110.

The silicon substrate 110 may include silicon. The silicon is inexpensive and easily processed as compared with a sapphire substrate.

The light emitting structure 145 can be formed on the silicon substrate 110 through MOCVD (metal organic chemical vapor deposition), CVD (chemical vapor deposition), PECVD (plasma-enhanced chemical vapor deposition), MBE (molecular beam epitaxy), or HVPE (hydride vapor phase epitaxy), but the embodiment is not limited thereto.

A buffer layer (not shown) can be formed between the first conductive semiconductor layer 130 and the silicon substrate 110 to attenuate the lattice mismatch and difference of the thermal explanation coefficient between the first conductive semiconductor layer 130 and the silicon substrate 110. For instance, the buffer layer can be prepared as a single layer or a multi-layer by using a semiconductor material having the compositional formula of $In_xAl_yGa_{1-x-y}N$ ($0 \leq x \leq 1$, $0 \leq y \leq 1$, $0 \leq x+y \leq 1$).

Figure 5:
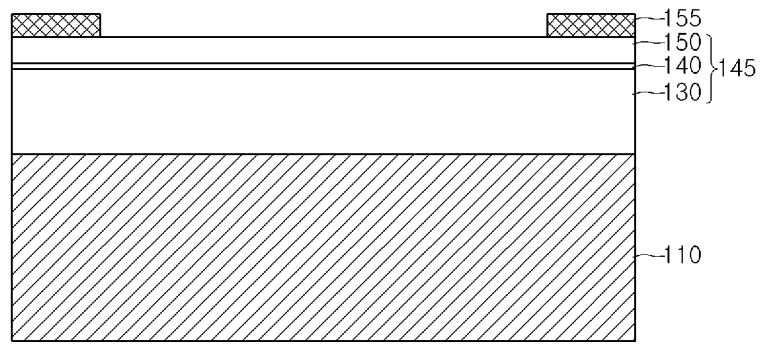

Referring to FIG. 5, the protective member 155 is formed on the peripheral portion of the light emitting structure 145. The protective member 155 may include a material having electric insulating property. For instance, the protective member 155 may include at least one selected from the group consisting of $SiO_2$, $Si_xO_y$, $Si_3N_4$, $Si_xN_y$, $SiO_xN_y$, $Al_2O_3$, $TiO_2$, ITO, AZO, AND ZnO. The protective member 155 may be formed through the deposition process, such as sputtering or PECVD, but the embodiment is not limited thereto.

Figure 6:
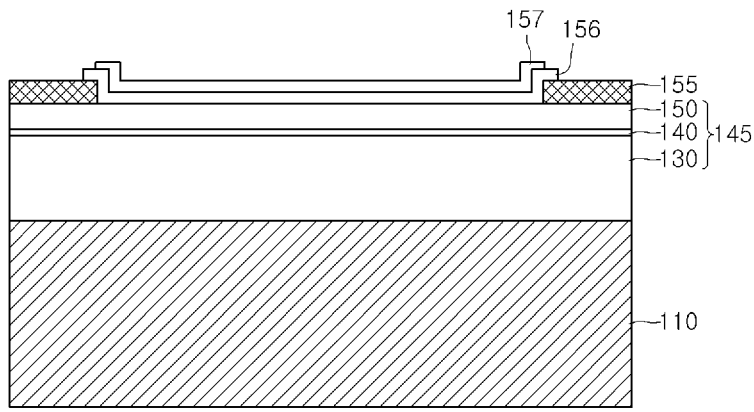

Referring to FIG. 6, the ohmic contact layer 156 is formed on the light emitting structure 145 and the reflective layer 157 is formed on the ohmic contact layer 156. The ohmic contact layer 156 and the reflective layer 157 can be formed through the deposition process, such as sputtering, PECVD, or E-beam evaporation, but the embodiment is not limited thereto.

The ohmic contact layer 156 may include at least one of ITO, Ni, Pt, Ir, Rh, and Ag. In addition, the reflective layer 157 may include a metal or an alloy including at least one of Ag, Al, Pt, Pd, and Cu.

Figure 7:
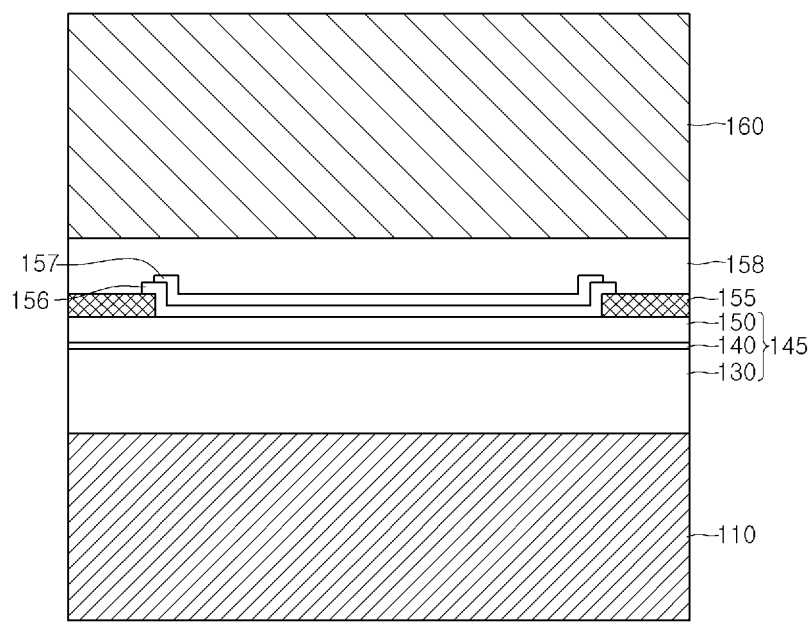

Referring to FIG. 7, the adhesive layer 158 is formed on the reflective layer 157 and the protective member 155, and the conductive support member 160 is formed on the adhesive layer 158.

The adhesive layer 158 may improve the interfacial adhesive strength between the conductive support member 160 and the light emitting structure 145. For instance, the adhesive layer 158 may include at least one selected from the group consisting of Ti, Au, Sn, Ni, Cr, Ga, In, Bi, Cu, Ag and Ta.

The conductive support member 160 is prepared as a sheet and bonded onto the top surface of the adhesive layer 158. Otherwise, the conductive support member 160 can be formed through the plating process or the deposition process. In this case, the adhesive layer 158 may be omitted.

The conductive support member 160 may include at least one of Ti, Cr, Ni, Al, Pt, Au, W, Cu, Mo, and a semiconductor substrate doped with impurities.

Figure 8:
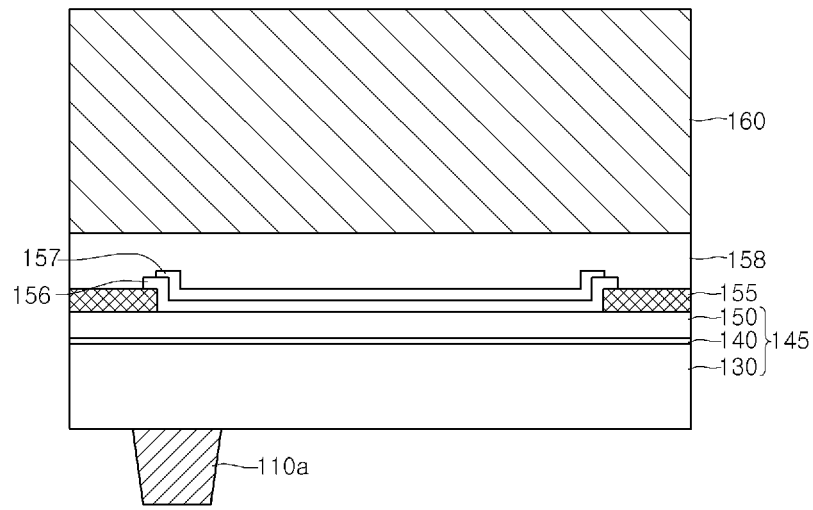

Referring to FIG. 8, the conductive member 110a of the protective device 115 is formed by selectively removing the silicon substrate 110. Preferably, the conductive member 110a is formed on the outer peripheral region of the bottom surface of the light emitting structure 145, but the embodiment is not limited thereto.

In detail, the silicon substrate 110 is selectively etched to form the conductive member 110a of the protective device 115. Preferably, as shown in FIG. 8, the conductive member 110a may have a polygonal column shape, but the embodiment may not limit the shape and the manufacturing process for the conductive member 110a. After that, the p type dopant is implanted into the conductive member 110a, so that the p type semiconductor layer is formed.

Since the silicon substrate 110 can be easily removed through the etching process, the LLO (laser lift off) process, which may reduce the product yield of the light emitting device, can be omitted, so that the reliability of the manufacturing process for the light emitting device 100 can be improved.

Meanwhile, the sapphire substrate can be employed as a base substrate of the light emitting structure 145 instead of the silicon substrate. In this case, the sapphire substrate is selectively removed through the LLO process and the conductive member 110a is formed on the light emitting structure 145 through the deposition process, but the embodiment is not limited thereto.

Figure 9:
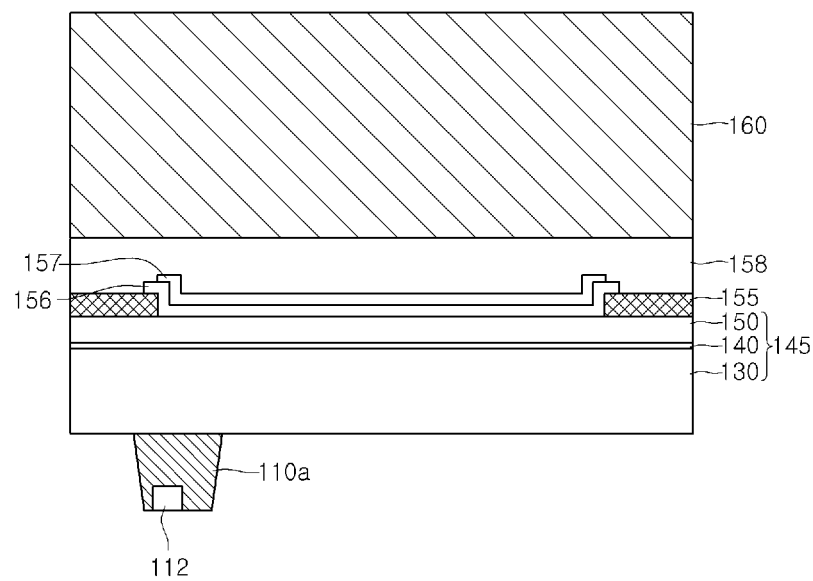

Referring to FIG. 9, the n type dopant is selectively implanted into the lower portion of the conductive member 110a to form the doping part 112. The doping part 112 is formed at a part of the lower portion of the conductive member 110a.

In order to form the doping part 112 in a desired position, the mask pattern is formed in the conductive member 110a and the n type dopant is implanted along the mask pattern through the ion implantation or the thermal diffusion, but the embodiment is not limited thereto.

Figure 10:
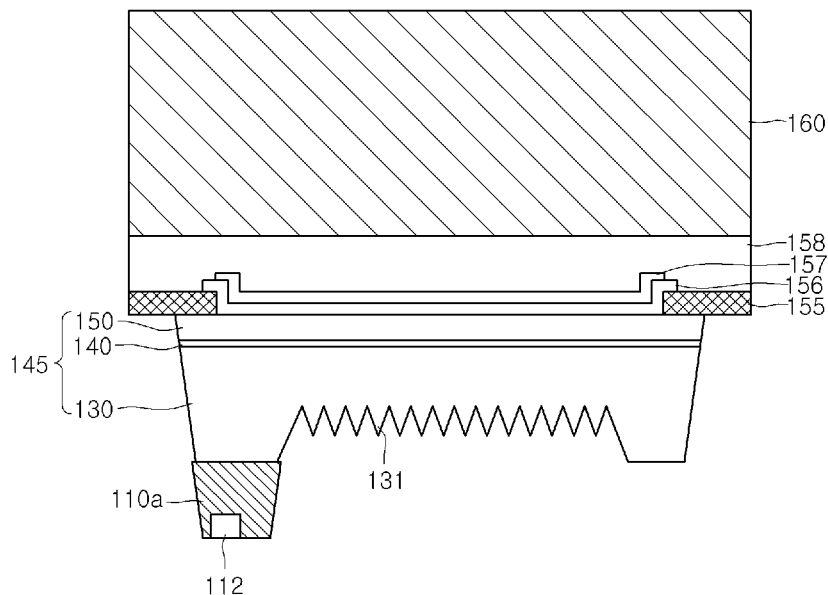

Referring to FIG. 10, the isolation etching is performed with respect to the light emitting structure 145 and the pattern or the roughness 131 is formed on the bottom surface of the light emitting structure 145, that is, on the bottom surface of the first conductive semiconductor layer 130 to improve the light extraction efficiency.

The light emitting device chips can be divided into individual chip units through the isolation etching. In addition, the light extraction efficiency can be improved by the pattern or the roughness 131.

A passivation layer (not shown) can be formed on at least one lateral side of the light emitting structure 145 to protect the light emitting structure 145. For instance, the passivation layer includes $SiO_2$, $SiO_x$, $SiO_xN_y$, $Si_3N_4$, or $Al_2O_3$, but the embodiment is not limited thereto.

Figure 11:
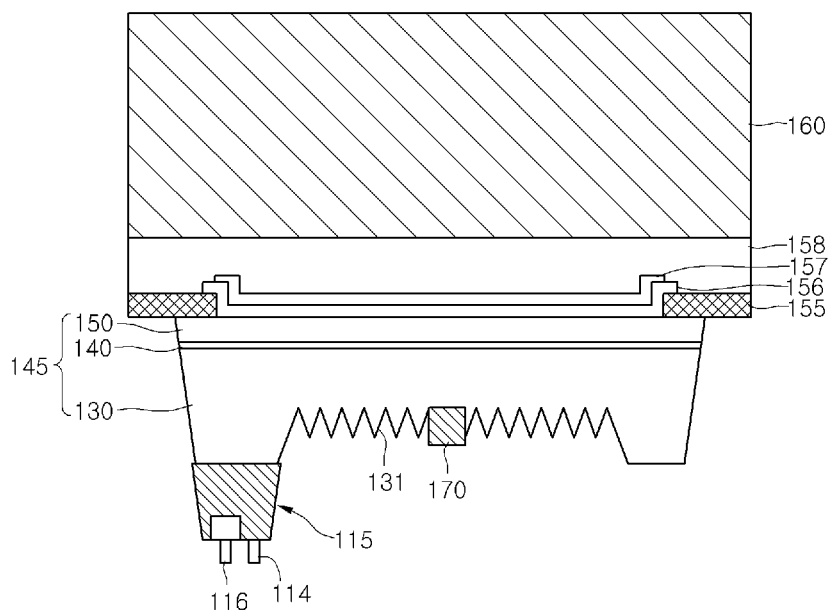

Referring to FIG. 11, the first electrode 170 is formed on the bottom surface of the light emitting structure 145, the third electrode 114 is formed on the bottom surface of the conductive member 110a, and the second electrode 116 is formed on the bottom surface of the doping part 112, thereby providing the light emitting device 100 including the protective device 115 according to the first embodiment.

At this time, the first and third electrodes 170 and 114 can be electrically connected to the same external electrode, and the conductive support member 160 and the second electrode 116 are electrically connected to the same external electrode.

Hereinafter, a light emitting device 100B and a method of manufacturing the same according to the second embodiment will be described in detail.

Figure 12:
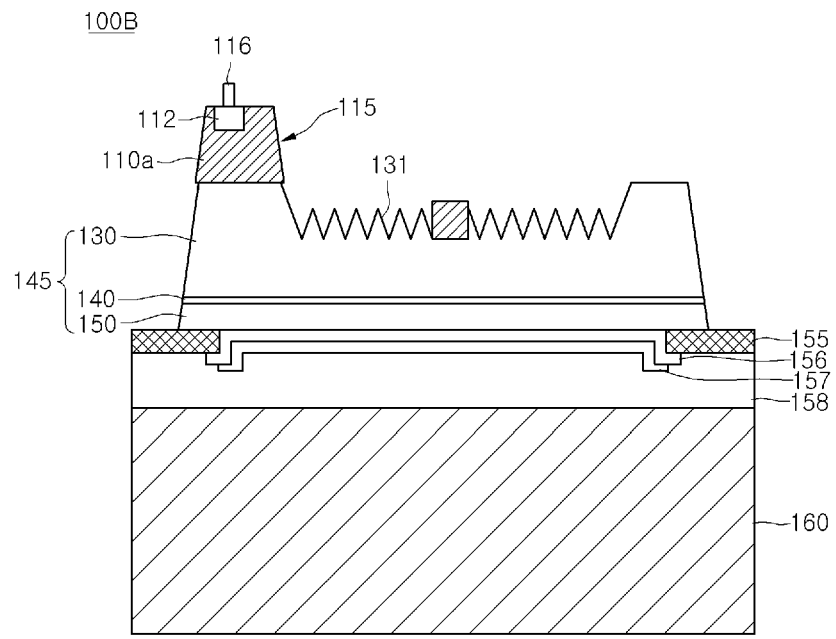
FIG. 12 is a sectional view of a light emitting device according to the second embodiment.

FIG. 12 is a sectional view of a light emitting device 100E according to the second embodiment. The light emitting device 100B according to the second embodiment is similar to the light emitting device 100 according to the first embodiment except for the electrode of the protective device and the operational principle thereof.

Referring to FIG. 12, the light emitting device 100B according to the second embodiment includes a conductive support member 160, an adhesive layer 158 on the conductive support member 160, a protective member 155 on the conductive support member 160 or on an outer peripheral region of a top surface of the adhesive layer 158, a reflective layer 157 on the adhesive layer 158, an ohmic contact layer 156 on the reflective layer 157, a light emitting structure 145 on the protective member 155 and the ohmic contact layer 156, a first electrode 170 on the light emitting structure 145, and a protective device 115b on the light emitting structure 145.

The light emitting structure 145 includes at least a first conductive semiconductor layer 130, an active layer 140 under the first conductive semiconductor layer 130, and a second conductive semiconductor layer 150 under the active layer 140. The first conductive semiconductor layer 130, the active layer 140 and the second conductive semiconductor layer 150 constitute a structure that generates light.

The following description will be made on the assumption that the first conductive semiconductor layer 130 includes an n type semiconductor layer and the second conductive semiconductor layer 150 includes a p type semiconductor layer, but the embodiment is not limited thereto.

The protective device 115b includes a conductive member 110a made from a silicon material and doped with n type dopant, a doping part 112 formed on the conductive member 110a and doped with p type dopant, and a second electrode 116 on the doping part 112. The second electrode 116 and the conductive support member 160 are connected to the same external power source.

If the forward current flows through the light emitting structure 145, the current may not flow through the protective device 115b so that the protective device 115b is not operated.

If the reverse current is applied to the light emitting structure 145, the current flows through the protective device 115b and the first conductive semiconductor layer 130, other than the light emitting structure 145, so that the active layer of the light emitting structure 145 can be prevented from being damaged.

In addition, if the excessive forward current higher than the breakdown voltage of the protective device 115b is applied to the light emitting structure, the protective device 115b is enabled, so that the current flows through the protective device 115b and the first conductive semiconductor layer 130, other than the light emitting structure 145, so that the active layer of the light emitting structure 145 can be prevented from being damaged.

Hereinafter, a light emitting device 100C and a method of manufacturing the same according to the third embodiment will be described in detail.

Figure 13:
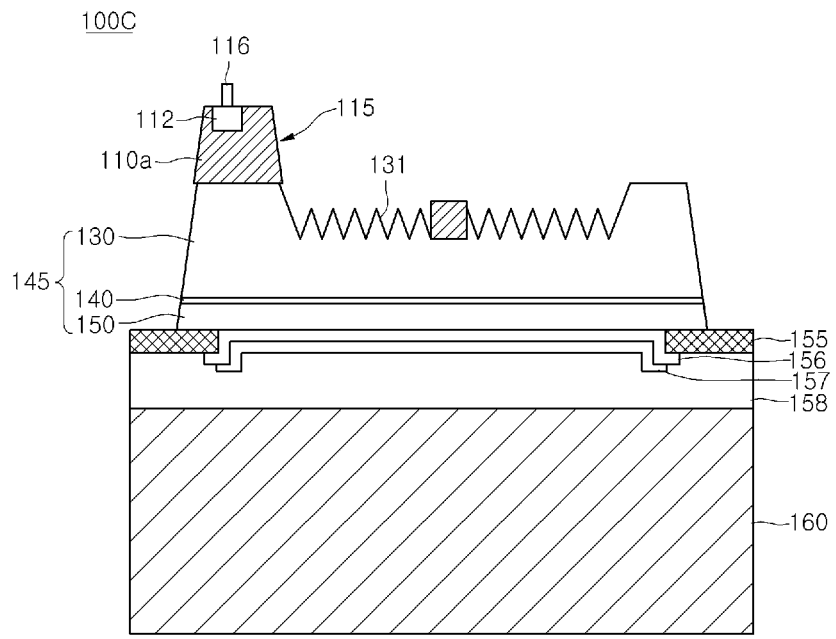
FIG. 13 is a sectional view of a light emitting device according to the third embodiment.

FIG. 13 is a sectional view of a light emitting device 100C according to the third embodiment. The light emitting device 100C according to the third embodiment is similar to the light emitting device 100 according to the first embodiment except for the first electrode, and the doping and operation principle of the protective device.

Referring to FIG. 13, the light emitting device 100C according to the third embodiment includes a conductive support member 160, an adhesive layer 158 on the conductive support member 160, a protective member 155 on the conductive support member 160 or on an outer peripheral region of a top surface of the adhesive layer 158, a reflective layer 157 on the adhesive layer 158, an ohmic contact layer 156 on the reflective layer 157, a light emitting structure 145 on the protective member 155 and the ohmic contact layer 156, a protective device 115c on the light emitting structure 145 and a second and third electrodes 116 and 114 on the protective device 115c.

The light emitting structure 145 includes at least a first conductive semiconductor layer 130, an active layer 140 under the first conductive semiconductor layer 130, and a second conductive semiconductor layer 150 under the active layer 140. The first conductive semiconductor layer 130, the active layer 140 and the second conductive semiconductor layer 150 constitute a structure that generates light. The following description will be made on the assumption that the first conductive semiconductor layer 130 includes an n type semiconductor layer and the second conductive semiconductor layer 150 includes a p type semiconductor layer, but the embodiment is not limited thereto.

The protective device 115c includes a conductive member 110a made from a silicon material and doped with n type dopant, a doping part 112 formed on the conductive member 110a and doped with p type dopant, the second electrode 116 on the doping part 112 and the third electrode 114 on the conductive member 110a.

In normal cases, that is, when the forward current is applied to the light emitting device 100C, the third electrode 114 and the conductive support member 160 supply power to the light emitting structure 145. This is because the conductive member 110a of the protective device 115c has polarity (n type) identical to that of the first conductive semiconductor layer 130.

If the reverse current is applied to the light emitting device 100C, the reverse current may not flow due to the rectifying function of the protective device 115c. However, if excessive reverse current is applied, the protective device 115c is enabled so that the reverse current flows through the protective device 115c, thereby protecting the light emitting structure 145 of the light emitting device 100C.

Figure 14:
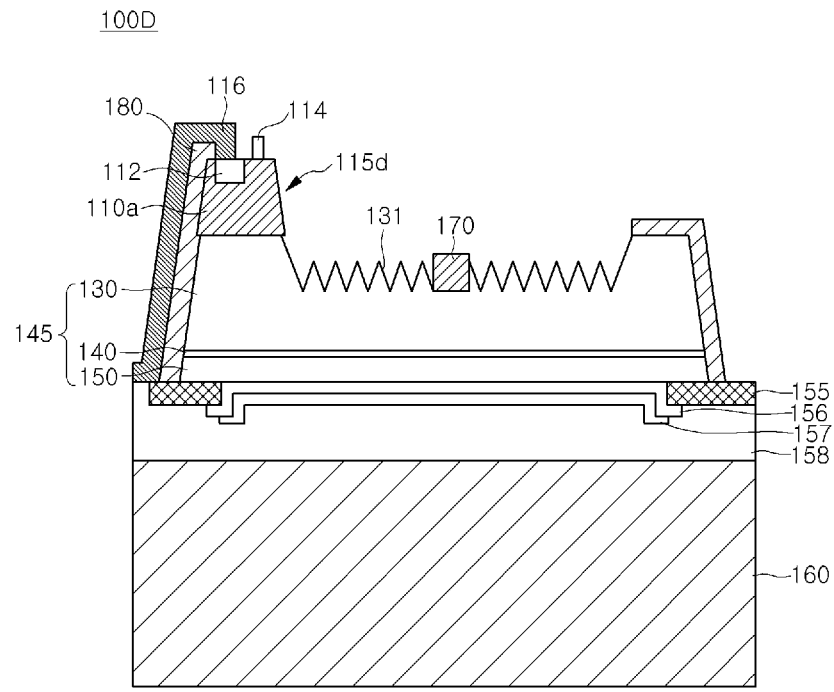
FIG. 14 is a sectional view of a light emitting device according to the fourth embodiment.

FIG. 14 is a sectional view of a light emitting device 100D according to the fourth embodiment. According to the light emitting device 100D of the fourth embodiment, a passivation layer 180 is formed on a lateral side of the light emitting structure 145 to protect the light emitting structure 145 from the external impact.

In the region where the protective device 115d is formed, the adhesive layer 158 is partially exposed through the protective member 155.

In detail, the protective member 155 formed in the region where the protective device 115d is formed may have a width narrower than the protective member 155 formed in the region where the protective device 115d is not formed, so that the adhesive layer 158 is partially exposed. In addition, the second electrode 116 is connected to the exposed part of the adhesive layer 158.

The second electrode 116 is formed on the passivation layer 180 adjacent to the protective device 115d and electrically connected to the adhesive layer 158. In detail, one end of the second electrode 116 makes contact with the doping part 112 and the other end of the second electrode 116 is connected to the adhesive layer 158. That is, the second electrode 116 is connected to the adhesive layer 158 and electrically connected to the conductive support member 160.

Referring to FIG. 14, the light emitting device 100D according to the fourth embodiment includes a conductive support member 160, an adhesive layer 158 on the conductive support member 160, a protective member 155 on the conductive support member 160 or on an outer peripheral region of a top surface of the adhesive layer 158, a reflective layer 157 on the adhesive layer 158, an ohmic contact layer 156 on the reflective layer 157, a light emitting structure 145 on the protective member 155 and the ohmic contact layer 156, a protective device 115d on the light emitting structure 145, and second and third electrodes 116 and 114 on the protective device 115d.

The light emitting structure 145 includes at least a first conductive semiconductor layer 130, an active layer 140 under the first conductive semiconductor layer 130, and a second conductive semiconductor layer 150 under the active layer 140. The first conductive semiconductor layer 130, the active layer 140 and the second conductive semiconductor layer 150 constitute a structure that generates light. The following description will be made on the assumption that the first conductive semiconductor layer 130 includes an n type semiconductor layer and the second conductive semiconductor layer 150 includes a p type semiconductor layer, but the embodiment is not limited thereto.

The protective device 115d includes a conductive member 110a made from a silicon material and doped with n type dopant, a doping part 112 formed on the conductive member 110a and doped with p type dopant, the second electrode 116 on the doping part 112 and the third electrode 114 on the conductive member 110a.

In normal cases, that is, when the forward current is applied to the light emitting device 100D, the third electrode 114 and the conductive support member 160 supply power to the light emitting structure 145. This is because the conductive member 110a of the protective device 115d has polarity (n type) identical to that of the first conductive semiconductor layer 130.

If the reverse current is applied to the light emitting device 100D, the reverse current may not flow due to the rectifying function of the protective device 115d. However, if excessive reverse current is applied, the protective device 115d is enabled so that the reverse current flows through the protective device 115d, thereby protecting the light emitting structure 145 of the light emitting device 100D.

Figure 15:
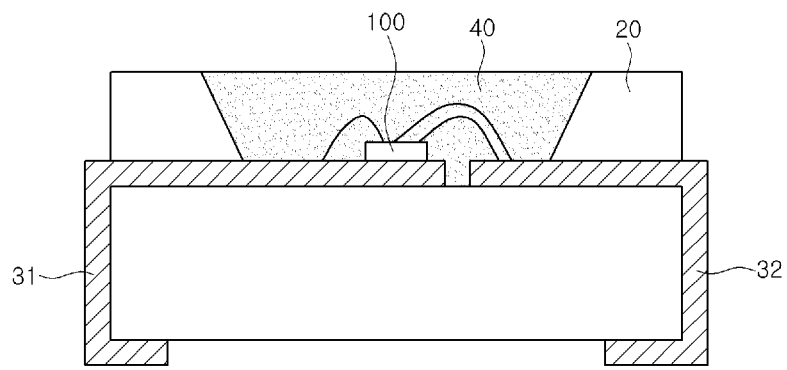
FIG. 15 is a sectional view showing a light emitting device package including a light emitting device according to the embodiments.

FIG. 15 is a sectional view showing a light emitting device package including the light emitting device according to the embodiments.

Referring to FIG. 15, the light emitting device package includes a package body 20, first and second electrode layers 31 and 32 formed on the package body 20, the light emitting device 100 provided on the package body 20 and electrically connected to the first and second electrode layers 31 and 32 and a molding member 40 that surrounds the light emitting device 100.

The package body 20 may include silicon, synthetic resin or metallic material. An inclined inner wall may be formed around the light emitting device.

The first and second electrode layers 31 and 32 are electrically isolated from each other to supply power to the light emitting device 100. In addition, the first and second lead electrodes 31 and 32 reflect the light emitted from the light emitting device 100 to improve the light efficiency and dissipate heat generated from the light emitting device 100 to the outside.

The light emitting device 100 is installed on the package body 20 and electrically connected to the first and second electrode layers 31 and 32. In detail, the light emitting device 100 is installed on one of the first and second electrode layers 31 and 32 and connected to the other of the first and second electrode layers 31 and 32 through a wire. The protective device of the light emitting device 100 is connected to the first and second electrode layers 31 and 32 through a wire. However, the embodiment does not limit the electrode connection structure of the light emitting device 100.

The molding member 40 surrounds the light emitting device 100 to protect the light emitting device 100. In addition, the molding member 40 may include luminescence materials to change the wavelength of the light emitted from the light emitting device 100.

Figure 16:
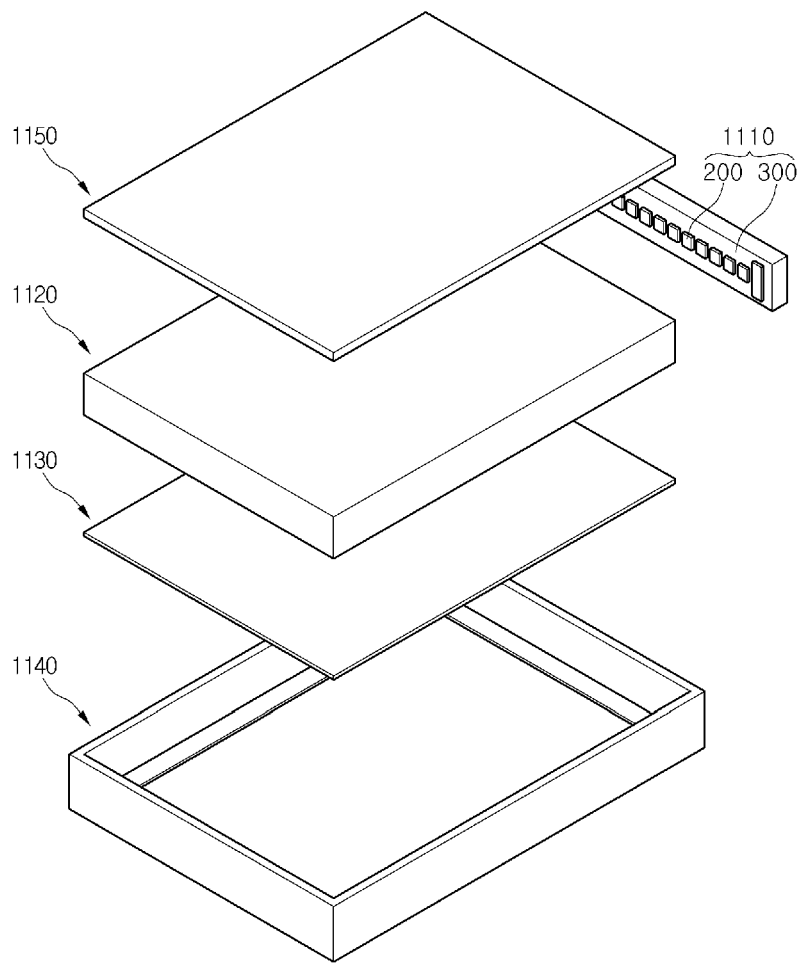
FIG. 16 is an exploded perspective view showing a backlight unit including a light emitting device or a light emitting device package according to the embodiment.

FIG. 16 is an exploded perspective view showing a backlight unit 1100 including the light emitting device or the light emitting device package according to the embodiment. The backlight unit 1100 shown in FIG. 16 is an example of a lighting system, but the embodiment is not limited thereto.

Referring to FIG. 16, the backlight unit 1100 includes a bottom frame 1140, a light guide member 1120 installed in the bottom frame 1140, and a light emitting module 1110 installed at one side or on the bottom surface of the light guide member 1120. In addition, a reflective sheet 1130 is disposed below the light guide member 1120.

The bottom frame 1140 has a box shape having an open top surface to receive the light guide member 1120, the light emitting module 1110 and the reflective sheet 1130 therein. In addition, the bottom frame 1140 may include a metallic material or a resin material, but the embodiment is not limited thereto.

The light emitting module 1110 may include a substrate and a plurality of light emitting device packages installed on the substrate according to the embodiments. The light emitting device packages 600 provide the light to the light guide member 1120.

As shown in FIG. 16, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100, but the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a liquid guide plate. The liquid guide plate can be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including luminescence materials.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 17:
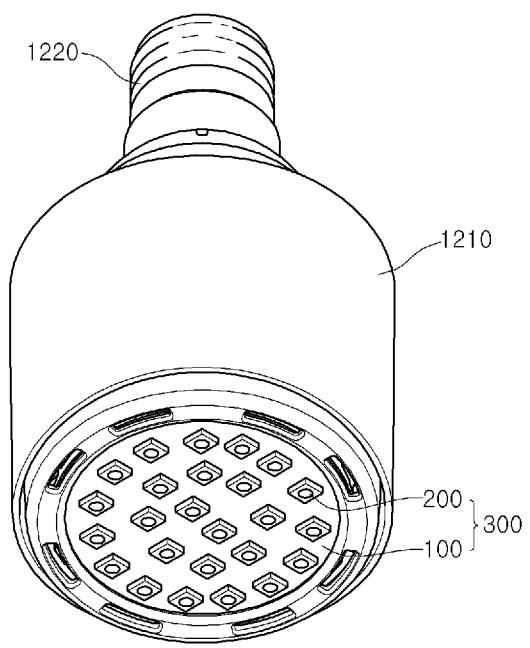
FIG. 17 is a perspective view showing a lighting unit including a light emitting device or a light emitting device package according to the embodiment.

FIG. 17 is a perspective view showing a lighting unit 1200 including the light emitting device or the light emitting device package according to the embodiment. The lighting unit 1200 shown in FIG. 17 is an example of a lighting system and the embodiment is not limited thereto.

Referring to FIG. 17, the lighting unit 1200 includes a case body 1210, a light emitting module 1230 installed in the case body 1210, and a connection terminal 1220 installed in the case body 1210 to receive power from an external power source.

Preferably, the case body 1210 includes material having superior heat dissipation property. For instance, the case body 1210 includes a metallic material or a resin material.

The light emitting module 1230 may include a substrate 300 and at least one light emitting device package 200 installed on the substrate 300.

The substrate 300 includes an insulating member printed with a circuit pattern. For instance, the substrate 300 includes a PCB (printed circuit board), an MC (metal core) PCB, a flexible PCB, or a ceramic PCB.

In addition, the substrate 300 may include a material that effectively reflects the light. The surface of the substrate 300 can be coated with a color, such as a white color or a silver color, to effectively reflect the light.

At least one light emitting device package 200 according to the embodiment can be installed on the substrate 300. Each light emitting device package 200 may include at least one LED (light emitting diode). The LED may include a colored LED that emits the light having the color of red, green, blue or white and a UV (ultraviolet) LED that emits UV light.

The LEDs of the light emitting module 1230 can be variously combined to provide various colors and brightness. For instance, the white LED, the red LED and the green LED can be combined to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow luminescence materials. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 17, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure including:
a first conductive semiconductor layer;
a second conductive semiconductor layer; and
an active layer between the first and second semiconductor layers;
a support electrode layer on a bottom surface of the light emitting structure;
a first electrode on a first top surface area of the light emitting structure;
a protective device on a second top surface of the light emitting structure; and
a protective member at an outer peripheral portion of a top surface of the support electrode layer,
wherein the second conductive semiconductor layer is disposed on the support electrode layer and the protective member,
wherein the protective device includes a semiconductor material, and
wherein the protective device vertically overlaps with at least one portion of the protective member.

2. The light emitting device of claim 1,
wherein the protective device includes:
a body;
a doping part disposed at an upper portion of the body; and
a second electrode on the doping part, and
wherein a bottom side of the body is directly disposed on the upper surface of the first conductive semiconductor layer.

3. The light emitting device of claim 2, wherein at least one top surface area of the protective member is exposed.

4. The light emitting device of claim 3, wherein the second conductive semiconductor layer is disposed on the support electrode layer and the protective member.

5. The light emitting device of claim 1, wherein a bottom surface of the protective device is higher than a top surface of the first electrode.

6. The light emitting device of claim 1, wherein the protective device is disposed on only an upper surface of the first conductive semiconductor layer.

7. The light emitting device of claim 1, wherein a lateral width of the protective device is smaller than a lateral width of the light emitting structure.

8. The light emitting device of claim 1, wherein the protective device includes a body including first conductive dopants, a doping part disposed at an upper portion of the body and including second conductive dopants, and a second electrode on the doping part.

9. The light emitting device of claim 8, wherein a bottom side of the body is directly disposed on the upper surface of the first conductive semiconductor layer.

10. The light emitting device of claim 8, wherein the first conductive dopants of the body are an opposite conductive type than the first conductive semiconductor layer.

11. The light emitting device of claim 8, wherein the first conductive semiconductor layer includes an N type semiconductor layer, the second conductive semiconductor layer includes a P type semiconductor layer, the first conductive dopants are P type dopants, and the second conductive dopants are N type dopants.

12. The light emitting device of claim 1, further comprising at least one of a reflective layer and an ohmic contact layer between the support electrode layer, and the second conductive semiconductor layer.

13. A light emitting device comprising:
a light emitting structure including a first conductive semiconductor layer, a second conductive semiconductor layer and an active layer between the first and second semiconductor layers;
a support electrode layer on a bottom surface of the light emitting structure;
a first electrode on a first top surface area of the light emitting structure;
a protective device on a second top surface of the light emitting structure; and
a protective member at an outer peripheral portion of a top surface of the support electrode layer,
wherein the protective device vertically overlaps with at least one portion of the protective member.

14. The light emitting device of claim 13, wherein the protective device includes:
a body;
a doping part disposed at an upper portion of the body; and
a second electrode on the doping part, and
wherein a bottom side of the body is directly disposed on the upper surface of the first conductive semiconductor layer.

15. The light emitting device of claim 13, wherein a bottom surface of the protective device is higher than a top surface of the first electrode.

16. The light emitting device of claim 13, wherein the protective device includes a body including first conductive dopants, a doping part disposed at an upper portion of the body and including second conductive dopants, and a second electrode on the doping part.

17. The light emitting device of claim 16, wherein the first conductive dopants of the body are an opposite conductive type than the first conductive semiconductor layer.

18. A light emitting device comprising:
a light emitting structure including a first conductive semiconductor layer, a second conductive semiconductor layer and an active layer between the first and second semiconductor layers;
a support electrode layer on a bottom surface of the light emitting structure;
a protective device on a top surface of the light emitting structure; and
a protective member at an outer peripheral portion of a top surface of the support electrode layer,
wherein the protective device vertically overlaps with at least one portion of the protective member,
wherein the protective device includes a body including first conductive dopants, a doping part disposed at an upper portion of the body and including second conductive dopants, and a second electrode on the doping part, and
wherein the first conductive dopants of the body are an opposite conductive type than the first conductive semiconductor layer.

19. The light emitting device of claim 18, wherein a bottom side of the body is directly disposed on the upper surface of the first conductive semiconductor layer.

20. The light emitting device of claim 18, wherein a bottom surface of the protective device is higher than a top surface of the first electrode.

* * * * *